US006645814B1

(12) United States Patent
Lindsay et al.

(10) Patent No.: US 6,645,814 B1
(45) Date of Patent: Nov. 11, 2003

(54) METHOD OF FORMING AN ARRAY OF FLASH FIELD EFFECT TRANSISTORS AND CIRCUITRY PERIPHERAL TO SUCH ARRAY

(75) Inventors: Roger W Lindsay, Boise, ID (US); Mark A. Helm, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/376,557

(22) Filed: Feb. 27, 2003

Related U.S. Application Data

(62) Division of application No. 10/179,893, filed on Jun. 24, 2002, now Pat. No. 6,579,763.

(51) Int. Cl.[7] .......................................... H01L 21/8232
(52) U.S. Cl. ....................................................... 438/258
(58) Field of Search ................................ 438/241, 258, 438/FOR 212

(56) References Cited

U.S. PATENT DOCUMENTS

| 6,265,267 | B1 | 7/2001 | Huang |
| 6,268,250 | B1 | 7/2001 | Helm |
| 6,380,031 | B1 | 4/2002 | Mehrad et al. |
| 6,396,100 | B2 | 5/2002 | Helm |
| 6,579,763 | B1 | 6/2003 | Lindsay |
| 2001/0004330 | A1 | * 6/2001 | Nam et al. .................. 365/200 |
| 2001/0044183 | A1 | * 11/2001 | Io ............................... 438/257 |
| 2002/0004270 | A1 | 1/2002 | Moriwaki et al. |
| 2002/0022323 | A1 | 2/2002 | Furuhata ..................... 438/258 |
| 2002/0127794 | A1 | * 9/2002 | Hashimoto et al. ......... 438/241 |
| 2003/0008458 | A1 | 1/2003 | Hashimoto et al. |
| 2003/0036234 | A1 | * 2/2003 | Doi ............................ 438/266 |

OTHER PUBLICATIONS

Kim et al., *Process Design for Preventing the Gate Oxide Thinning in the Integration of Dual Gate Oxide Transistor*, 41 JPN. J. APPL. PHYS., Part 1, No. 4B, pp. 2404–2409 (Apr. 2002).

* cited by examiner

Primary Examiner—George Fourson
Assistant Examiner—Joannie Adelle Garcia
(74) Attorney, Agent, or Firm—Wells St. John P.S.

(57) ABSTRACT

Thermal oxidation of a peripheral area of a semiconductor substrate is globally restricted with an overlying oxidation resistant layer that is not globally received within the array during formation of a sacrificial oxide layer prior to forming any transistor gate dielectric layer within the array. At least some FLASH field effect transistor gates having floating gate dielectric of a first thickness are formed within the array and at least some non-FLASH field effect transistor gates having gate dielectric of a second thickness are formed within the periphery, with the first and second thicknesses being different. Other aspects and implementations are disclosed.

26 Claims, 9 Drawing Sheets

_Fig 1_
_PRIOR ART_

_Fig 2_

ND OF FORMING AN ARRAY OF
METHOD OF FORMING AN ARRAY OF FLASH FIELD EFFECT TRANSISTORS AND CIRCUITRY PERIPHERAL TO SUCH ARRAY

RELATED PATENT DATA

This patent resulted from a divisional application of U.S. patent application Ser. No. 10/179,893, filed Jun. 24, 2002 now U.S. Pat. No. 6,579,763, entitled "Method of Forming an Array of FLASH Field Effect Transistors and Circuitry Peripheral to Such Array", naming Roger W. Lindsay and Mark A. Helm as inventors, the disclosure of which is incorporated by reference.

TECHNICAL FIELD

This invention relates to a method of forming an array of FLASH field effect transistors and circuitry peripheral to such array.

BACKGROUND OF THE INVENTION

Memory is but one type of integrated circuitry. Some memory circuitry allows for both on-demand data storage and data retrieval. For example, memories which allow both writing and reading, and whose memory cells can be accessed in a random order independent of physical location, are referred to as random-access memories (RAM). Read-only memories (ROMs) are those in which only the read operation can be performed rapidly. Entering data into a read-only memory is typically referred to as programming, and the operation is considerably slower than the writing operation utilized in random-access memory. With random-access memory, information is typically stored with respect to each memory cell either through charging of a capacitor or the setting of a state of a bi-stable flip-flop circuit. With either, the stored information is destroyed when power is interrupted. Read-only memories are typically non-volatile, with the data being entered during manufacturing or subsequently during programming.

Some read-only memory devices can be erased as well as written to by a programmer. Erasable read-only memory typically depends on the long-term retention of electronic charge as the information storage mechanism. The charge is typically stored on a floating semiconductive gate, such as polysilicon. One type of read-only memory comprises FLASH memory. Such memory can be selectively erased rapidly through the use of an electrical erase signal.

A FLASH memory cell typically comprises a single floating gate transistor. For multiple storage cells, such as used in large semiconductor memories, the storage cells of the memory are arranged in an array consisting of rows and columns. The rows are typically considered as comprising individual conductive gate lines formed as a series of spaced floating gates received along a single conductive line (hereafter referred to as "a line of floating gates"). Source and drain regions of the cells are formed relative to active area of a semiconductor substrate, with the active areas being generally formed in lines running substantially perpendicular to the lines of floating gates. The sources and drains are formed on opposing sides of the lines of floating gates within the active area with respect to each floating gate of the array. Thus, lines (rows) of programmable transistors are formed.

Electrical connections are made with respect to each drain to enable separate accessing of each memory cell. Such interconnections are arranged in lines comprising the columns of the array. The sources in FLASH memory, however, are typically all interconnected and provided at one potential, for example ground, throughout the array. Accordingly, the source regions along a given line of floating gates are typically all provided to interconnect within the substrate in a line running parallel and immediately adjacent the line of floating gates. These regions of continuously running source area are interconnected outside of the array, and strapped to a suitable connection for providing the desired potential relative to all the sources within the array.

FLASH memory fabrication typically includes an array of FLASH field effect transistors and circuitry which is peripheral to the array. Array FLASH field effect transistors and periphery field effect transistors typically have different gate dielectric or gate oxide thicknesses, and accordingly, are typically fabricated at different times. Usually, the periphery gate dielectric is generally thicker than the array gate dielectric due to higher voltage operation of periphery transistors as compared to that of the array. The periphery gate dielectric can be fabricated after the fabrication of the array gate dielectric. Unfortunately, this results in the typical isolation oxide within the periphery being subjected to a greater quantity of oxide etchings than occurs relative to the isolation oxide within the array. This can result in significant exposure of a corner of silicon where the active area meets the substrate isolation where a transistor gate passes from over active area to over isolation oxide. This can adversely affect the circuitry in operation.

Figure 1:
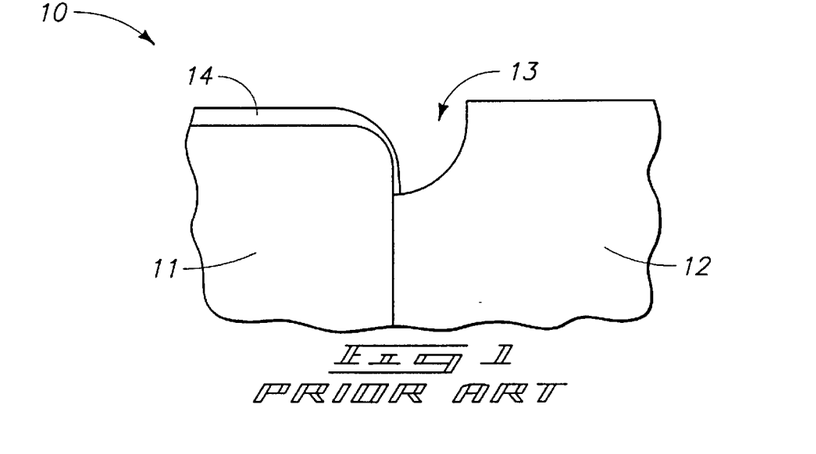
FIG. 1 is a diagrammatic sectional view of a prior art wafer fragment.

FIG. 1 depicts the problem just described. A semiconductor wafer fragment 10 is shown as appearing in a periphery circuit area to an array of FLASH field effect transistors (not shown) being fabricated. Such comprises a bulk active area substrate region 11 having an adjacent region of trench isolation oxide 12. To produce the active area and trench or other field isolation, typical prior art processing would first deposit a pad oxide layer over the substrate and then a silicon nitride comprising layer thereover. The pad oxide and silicon nitride layer would be patterned and etched relative to the bulk substrate to define and form exposed isolation areas of the bulk substrate. With trench isolation, trenches would be etched into the bulk substrate and subsequently filled with an insulative isolation material, for example silicon dioxide. The substrate is then polished and/or etched effective to remove at least the masking silicon nitride and expose or etch through the pad oxide. The periphery is then masked, typically with photoresist, with the array left exposed. One or more conductivity modifying implants are then conducted into semiconductive material of the substrate within the array. Exemplary such implants include $V_t$ threshold implants and channel enhancement implants.

The mask is subsequently stripped and the entire substrate subjected to a thermal oxidation to form a sacrificial oxide. Typically, such oxide is grown to correct defects and otherwise improve the semiconductive material substrate outer portion/surface for a subsequent gate oxide growth. Thereafter, the sacrificial oxide and any remaining pad oxide are stripped from the substrate. Gate oxide is then formed which is optimized for the array, but/and also grows over the periphery in a blanket manner. Floating gate material is then deposited, with the array then being patterned in at least one dimension towards formation of the floating gates. In such patterning, all such floating control gate material and the gate dielectric are typically etched from the periphery.

Next, another gate dielectric (typically an oxide-nitride-oxide composite) is formed over the control gate material within the array, and accordingly, blanketly over the substrate and, therefore, within the periphery. The array is then masked, and then the gate dielectric formed in the periphery is stripped.

All of the above-described sacrificial oxidation stripping, first gate oxide stripping and second gate oxide stripping within the periphery has a tendency to form a recess 13 (FIG. 1) where isolation oxide 12 meets with active area bulk semiconductive material 11. Typically, a gate oxide layer 14 is formed next, optimized for the periphery field effect transistors. Such can result in the illustrated gate oxide thinning over the active area bulk material corner. This can lead to adverse operation of the circuitry in operation.

The invention was motivated in addressing the above-described issues and improving upon the above-described drawbacks. However, it is in no way so limited. The invention is only limited by the accompanying claims as literally worded (without interpretative or other limiting reference to the above background art description, remaining portions of the specification or the drawings) and in accordance with the doctrine of equivalents.

SUMMARY

The invention includes methods of forming an array of FLASH field effect transistors and circuitry peripheral to such array. In one implementation, thermal oxidation of a peripheral area of a semiconductor substrate is globally restricted with an overlying oxidation resistant layer that is not globally received within the array during formation of a sacrificial oxide layer prior to forming any transistor gate dielectric layer within the array. At least some FLASH field effect transistor gates having floating gate dielectric of a first thickness are formed within the array and at least some non-FLASH field effect transistor gates having gate dielectric of a second thickness are formed within the periphery, with the first and second thicknesses being different.

In one implementation, a method of forming an array of FLASH field effect transistors and circuitry peripheral to such array includes providing a pad oxide over an array area and a periphery area of a semiconductor substrate. A silicon nitride comprising layer is formed over the pad oxide at least within the periphery. A mask is formed over the silicon nitride comprising layer in the periphery while leaving the array exposed. At least one conductivity modifying implant is then conducted into the substrate through the pad oxide within the array using the mask. After the conducting, the mask is removed. Thereafter, at least some FLASH transistor gates are formed within the array and at least some non-FLASH transistor gates are formed within the periphery.

Other aspects and implementations are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 2:
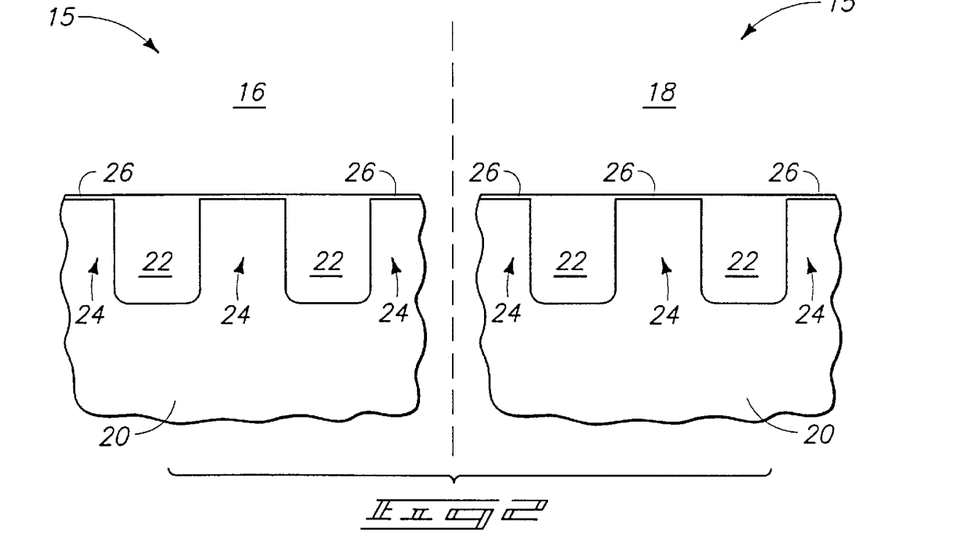
FIG. 2 is a diagrammatic sectional view of a wafer fragment at a processing in accordance with an aspect of the invention.

Methods of forming an array of FLASH field effect transistors and circuitry peripheral to such array are described in preferred embodiments below and, by way of example only, as shown in FIGS. 2–17. Referring initially to FIG. 2, a wafer fragment 15 is depicted as comprising an exemplary array area 16 and a periphery area 18. Substrate 15 comprises a semiconductor substrate 20, preferably constituting bulk monocrystalline silicon. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of this document, the term "layer" includes both the singular and the plural unless otherwise indicated.

Bulk substrate 20 has been processed to form field isolation regions 22 and active area 24 therebetween. In the depicted embodiment, field isolation 22 is in the form of trench isolation, with but one example preferred material being silicon dioxide preferably deposited by high density plasma deposition. In the depicted preferred embodiment and as generally described above, such has been formed in part by using a pad oxide 26 which is shown remaining at least over active areas 24. An exemplary thickness for such pad oxide is from 80 Angstroms to 150 Angstroms over active areas 24.

Figure 3:
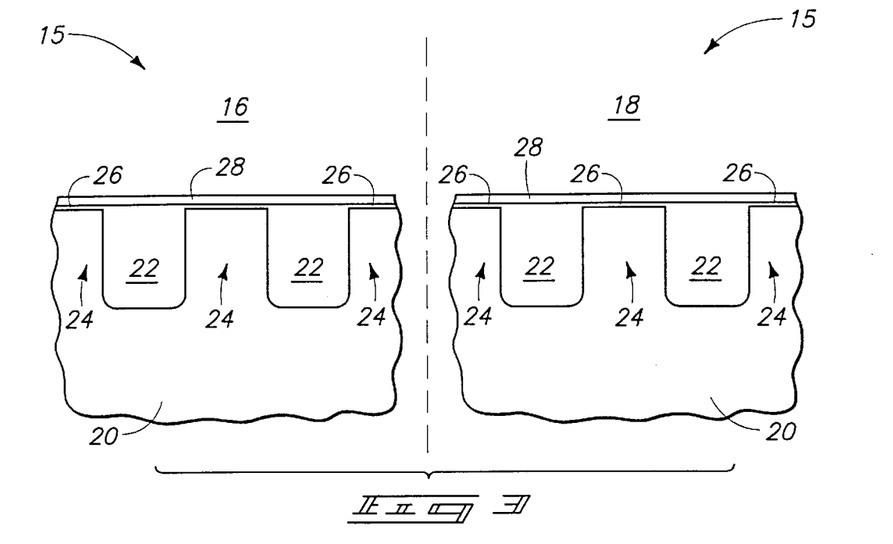
FIG. 3 is a view of the FIG. 2 wafer fragment at a processing step subsequent to that shown by FIG. 2.

Referring to FIG. 3, a sacrificial masking layer 28 is formed over pad oxide 26 within array 16 and with periphery 18. In one aspect, sacrificial masking layer 28 is oxidation resistant. In one aspect, sacrificial masking layer 28 is oxide etch resistant. In one aspect, the oxidation resistance of layer 28 might be primarily due to composition, and in another aspect primarily due to thickness as opposed to composition. In one aspect, a layer 28 comprises silicon nitride formed over pad oxide at least within the periphery, and preferably consists essentially of silicon nitride. Silicon nitride is a material which is both oxidation resistant and oxide etch resistant primarily due to composition, at least when of a sufficiently minimal thickness of 100 Angstroms. By way of example only, alternate exemplary oxidation resistant by composition materials include aluminum oxide and silicon carbide. Preferably, layer 28 has a thickness of no greater than 300 Angstroms, with a more preferred range being from 100 Angstroms to 200 Angstroms above pad oxide 26.

Further by way of example only, an exemplary oxidation resistant material, which would primarily be due to its thickness as opposed to its composition, would be polysilicon. If polysilicon were used as a primary or sole constituent of layer 28, such polysilicon would preferably have a thickness range of from about 300 Angstroms to about 1000 Angstroms.

Figure 4:
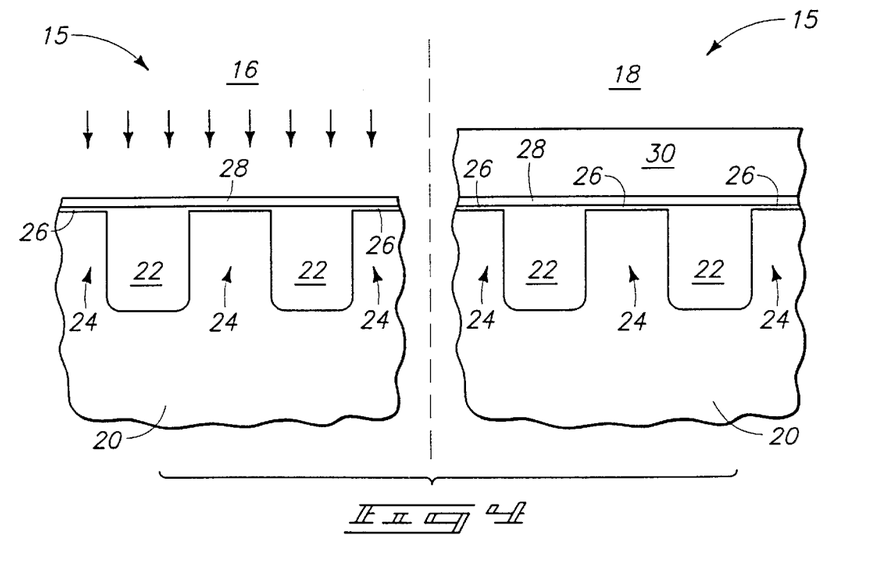
FIG. 4 is a view of the FIG. 3 wafer fragment at a processing step subsequent to that shown by FIG. 3.

Referring to FIG. 4, a mask 30 is formed over sacrificial masking layer 28 in periphery 18 while leaving sacrificial masking layer 28 within array 16 exposed. A preferred material for mask 30 is photoresist. At least one conductivity modifying implant is conducted into the semiconductive material of the substrate within array 16 (i.e., as indicated by the depicted vertical arrows, by way of example only) through the remaining pad oxide and the sacrificial masking layer 28 within array 16 using masking 30. Such masking largely shields substrate material 20 therebeneath from such implant. Example preferred implants include one or both of a $V_t$ implant and a channel enhancement implant. Any other method of conducting the same, with or without masking 30 and whether existing or yet-to-be-developed, is contemplated.

Figure 5:
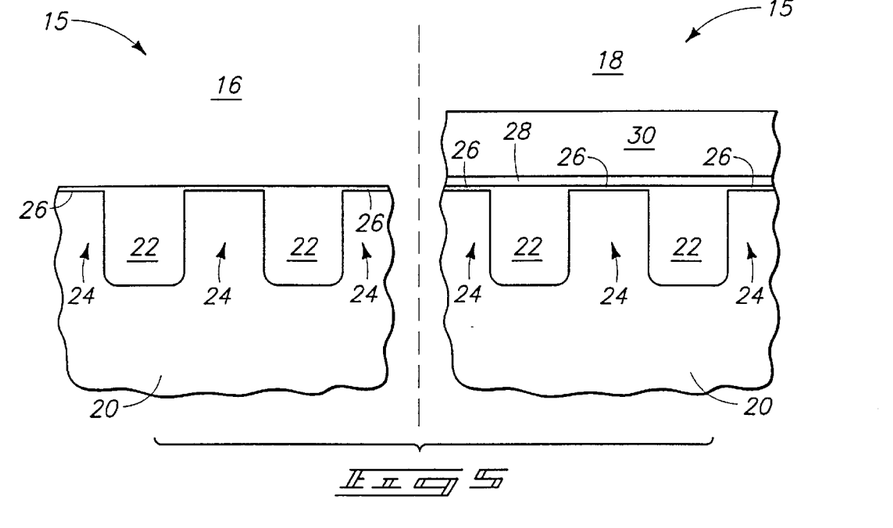
FIG. 5 is a view of the FIG. 4 wafer fragment at a processing step subsequent to that shown by FIG. 4.

Referring to FIG. 5 and using mask 30, sacrificial masking layer 28 exposed within the array 16 is removed while leaving sacrificial masking layer 28 masked within periphery 18. Preferably, such is conducted by any suitable dry or wet chemical etch, which may or may not remove some or all of the pad oxide. The just-described and depicted embodiment removes the sacrificial masking layer from the array after conducting the described conductivity modifying implant. Alternately, the sacrificial masking layer removing could be conducted before conducting such conductivity modifying implant.

Figure 6:
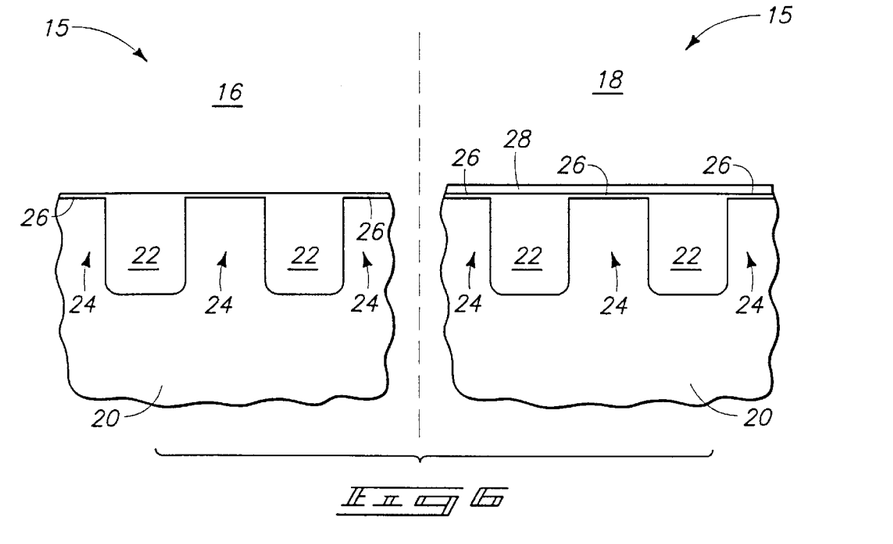
FIG. 6 is a view of the FIG. 5 wafer fragment at a processing step subsequent to that shown by FIG. 5.

Referring to FIG. 6, masking 30 (not shown) has been removed.

Figure 7:
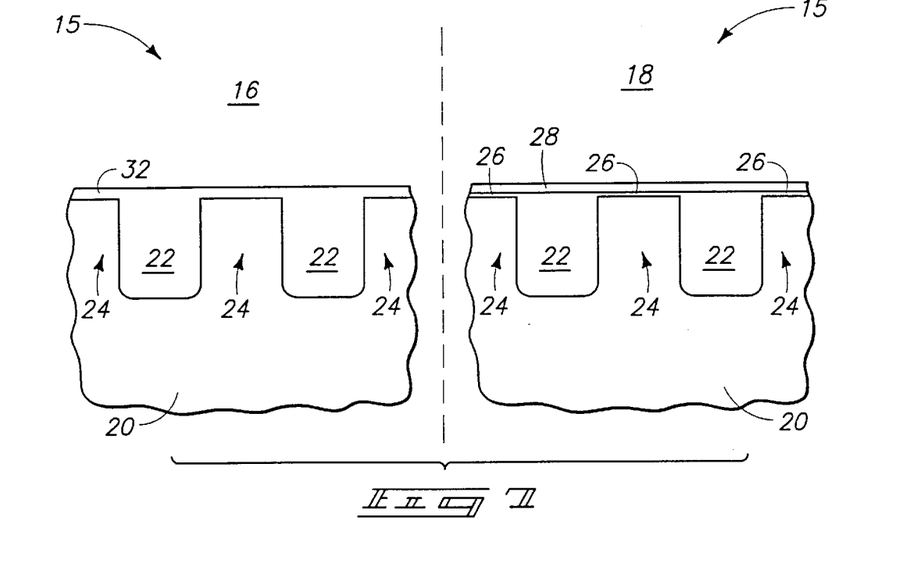
FIG. 7 is a view of the FIG. 6 wafer fragment at a processing step subsequent to that shown by FIG. 6.

Referring to FIG. 7, a sacrificial oxide 32 is thermally grown from the oxidation of substrate material 20 within array 16, with sacrificial masking layer 28 in periphery 18 preferably restricting oxidation of substrate material 20 within periphery 18 during such thermal growing. A preferred method of forming such sacrificial oxide is by thermal oxidation and the growing of layer 32 through and proximate any remaining pad oxide, for example using an atmospheric furnace oxidation at 800° C. utilizing a hydrogen and oxygen containing chemistry. A preferred thickness for sacrificial oxide 32 (including any pad oxide) over the active area is from about 120 Angstroms to about 200 Angstroms.

In one considered aspect, the above describes but one exemplary method of globally restricting thermal oxidation of a peripheral area of a semiconductor substrate with an overlying oxidation resistant layer that is not globally received within the array during the formation of a sacrificial oxide layer prior to forming any transistor gate dielectric layer within the array. Any other method as just so literally stated, and with or without a mask and whether existing or yet-to-be developed, is contemplated.

Figure 8:
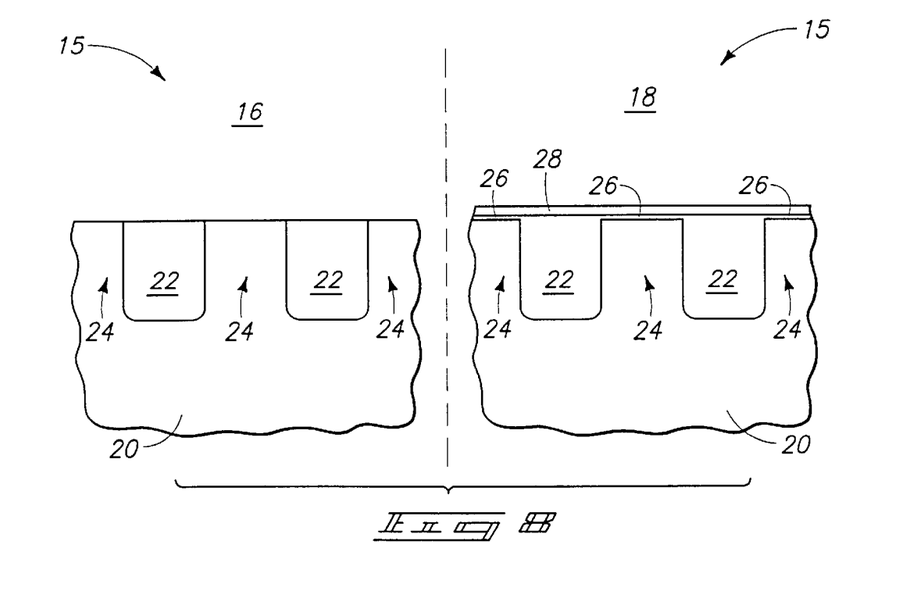
FIG. 8 is a view of the FIG. 7 wafer fragment at a processing step subsequent to that shown by FIG. 7.

Referring to FIG. 8, oxide (for example and preferably all of sacrificial oxide 32 and any remaining pad oxide) is etched from array 16, with sacrificial masking 28 in periphery 18 restricting the etching of oxide within periphery 18 during such etching. Any suitable wet or dry oxide etching, whether existing or yet-to-be developed, can of course be utilized.

Figure 9:
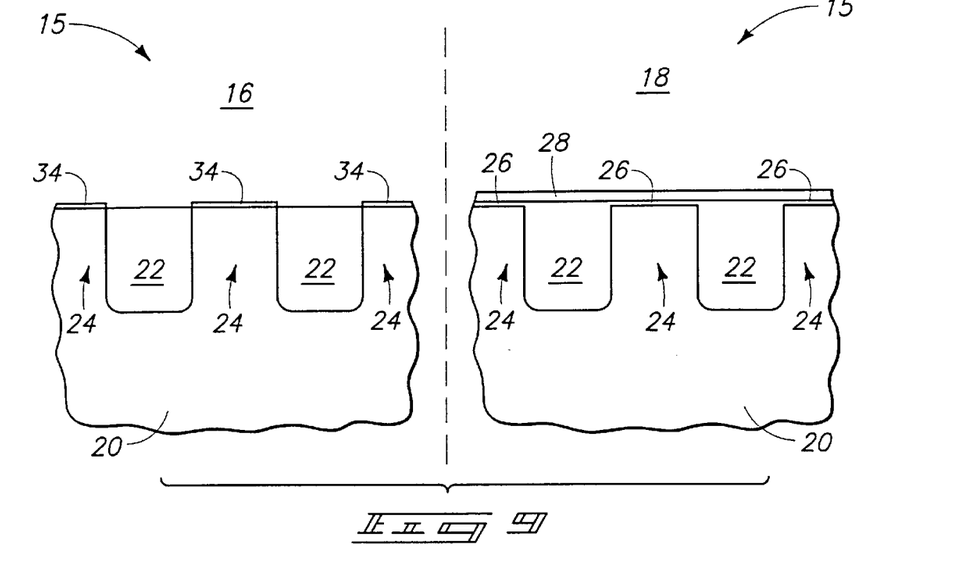
FIG. 9 is a view of the FIG. 8 wafer fragment at a processing step subsequent to that shown by FIG. 8.

Referring to FIG. 9, a gate dielectric 34, typically silicon dioxide, is formed at least within array 16. Typically, such oxide formation is conducted by thermal growth. Further, sacrificial masking layer 28 received within periphery 18 preferably restricts the oxidation of the semiconductive material of the substrate within periphery 18 during the formation of layer 34 within array 16. An exemplary preferred thickness for layer 34 is from 90 Angstroms to 100 Angstroms.

Figure 10:
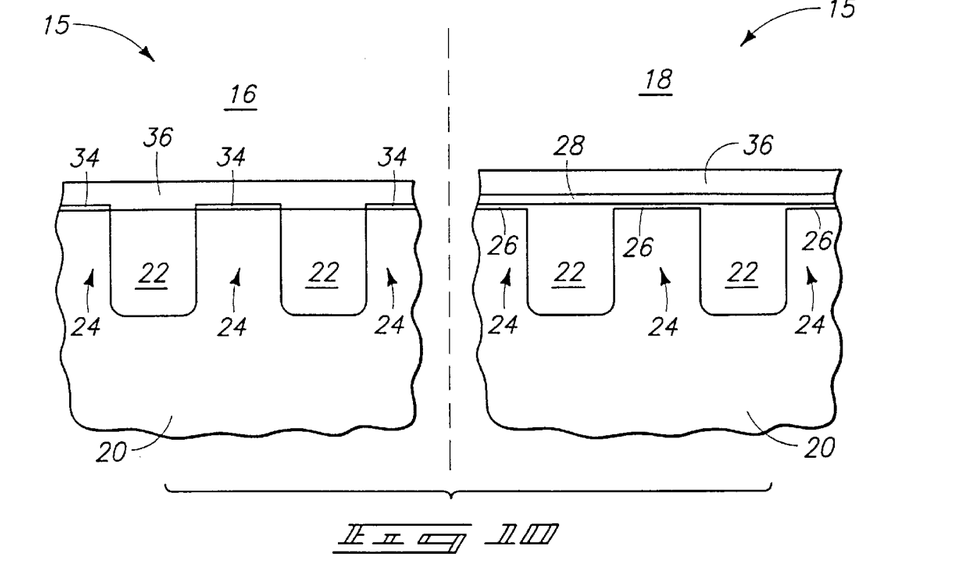
FIG. 10 is a view of the FIG. 9 wafer fragment at a processing step subsequent to that shown by FIG. 9.

Referring to FIG. 10, a floating gate conductively doped semiconductive material 36 is formed at least within array 16 over gate oxide 34 and, as well, over periphery 18 as shown. An example material is polysilicon.

Figure 11:
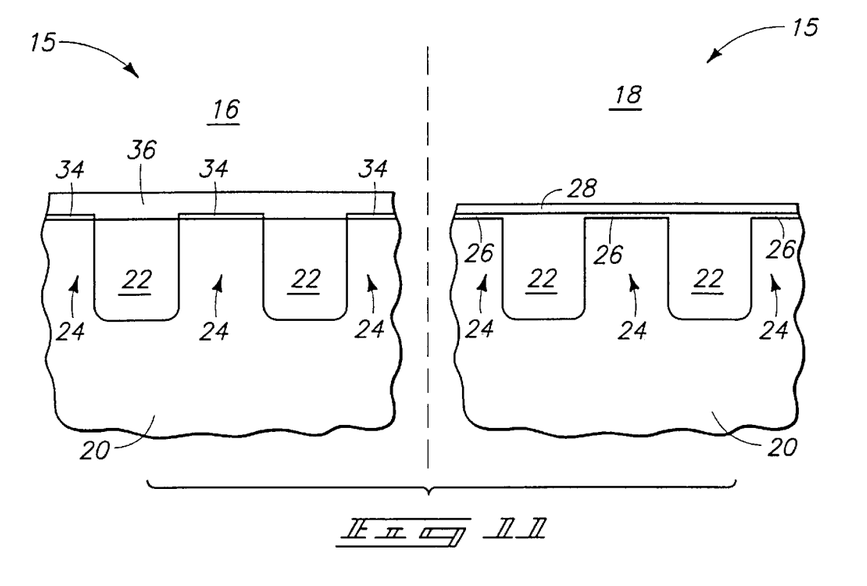
FIG. 11 is a view of the FIG. 10 wafer fragment at a processing step subsequent to that shown by FIG. 10.

Referring to FIG. 11, floating gate conductively doped semiconductive material 36 would typically then be patterned (by way of example only, using photoresist masking and etch) in at least one direction/dimension within array 16, and be removed from periphery 18.

Figure 12:
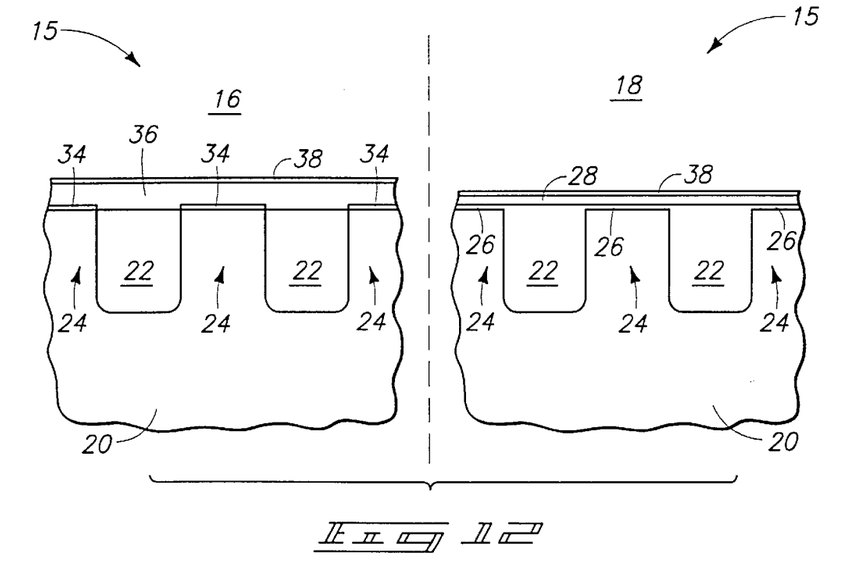
FIG. 12 is a view of the FIG. 11 wafer fragment at a processing step subsequent to that shown by FIG. 11.

Referring to FIG. 12, a control gate dielectric 38 has been formed over floating gate conductively semiconductive material 36 within array 16, and typically accordingly also within periphery 18. An exemplary preferred material 38 is a composite of silicon dioxide-silicon nitride-silicon dioxide layers. Exemplary thicknesses, top-to-bottom, are 40 Angstroms, 100 Angstroms and 30 Angstroms, respectively.

Figure 13:
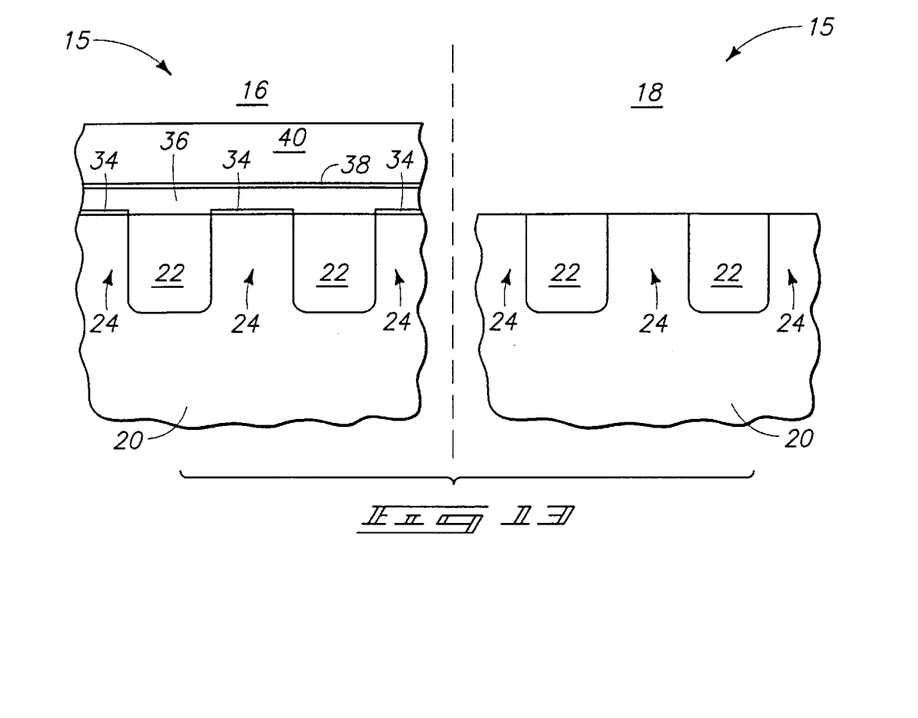
FIG. 13 is a view of the FIG. 12 wafer fragment at a processing step subsequent to that shown by FIG. 12.

Referring to FIG. 13, a masking 40 is formed within array 16. With such masking in place, periphery gate dielectric 38, sacrificial masking layer 28 and any remaining pad oxide are removed from periphery 18, preferably by one or more wet and/or dry etchings. An exemplary and preferred material for masking 40 is photoresist.

Figure 14:
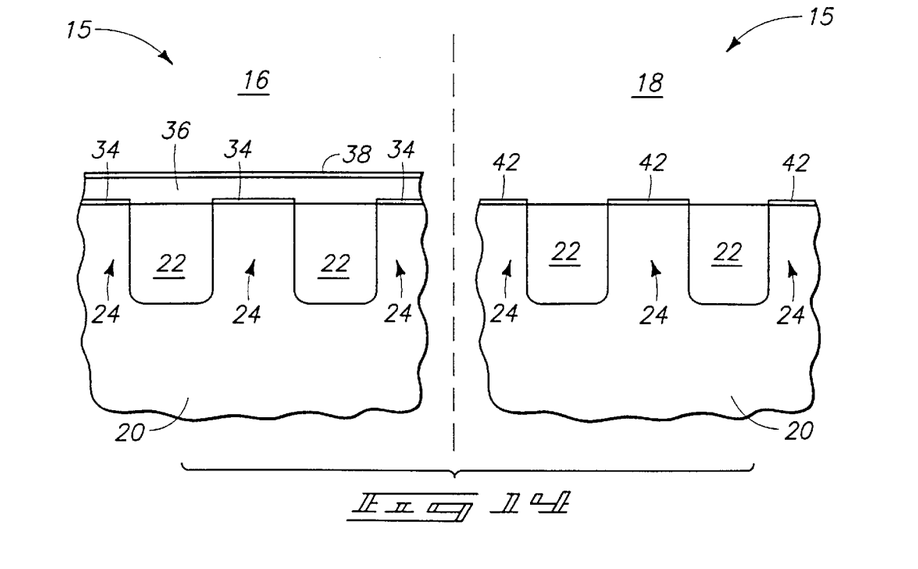
FIG. 14 is a view of the FIG. 13 wafer fragment at a processing step subsequent to that shown by FIG. 13.

Referring to FIG. 14, masking 40 has been removed and a periphery gate dielectric layer 42 (i.e., silicon dioxide) is formed on monocrystalline silicon 20 of active area 24 within periphery 18. As referred to above, the periphery gate dielectric is preferably optimized for the periphery field effect transistors, and is preferably thicker than that for the array floating gates. An exemplary preferred thickness for gate dielectric 42 is from 120 Angstroms to 200 Angstroms.

Figure 15:
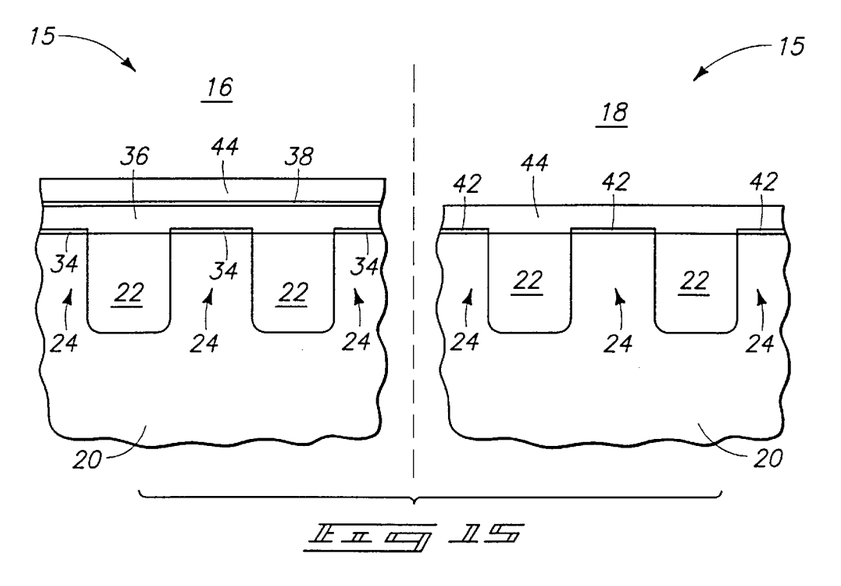
FIG. 15 is a view of the FIG. 14 wafer fragment at a processing step subsequent to that shown by FIG. 14.

Referring to FIG. 15, a conductively doped semiconductive material 44 (i.e., polysilicon) is formed over array 16 and periphery 18.

Figure 16:
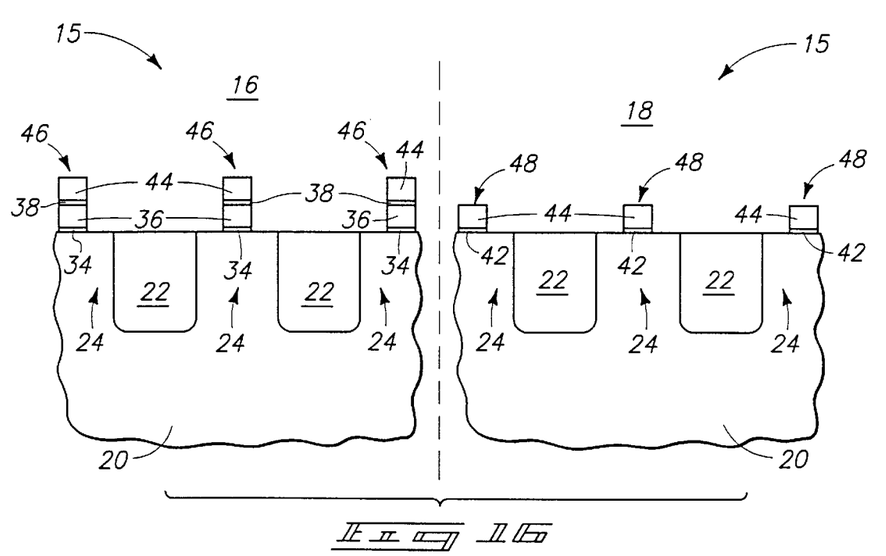
FIG. 16 is a view of the FIG. 15 wafer fragment at a processing step subsequent to that shown by FIG. 15.

Referring to FIG. 16, the depicted FIG. 15 materials have been patterned into at least some FLASH control transistor gate lines 46 within array 16, and into at least some non-FLASH transistor gate lines 48 within periphery 18. Source/drains would also be formed.

Figure 17:
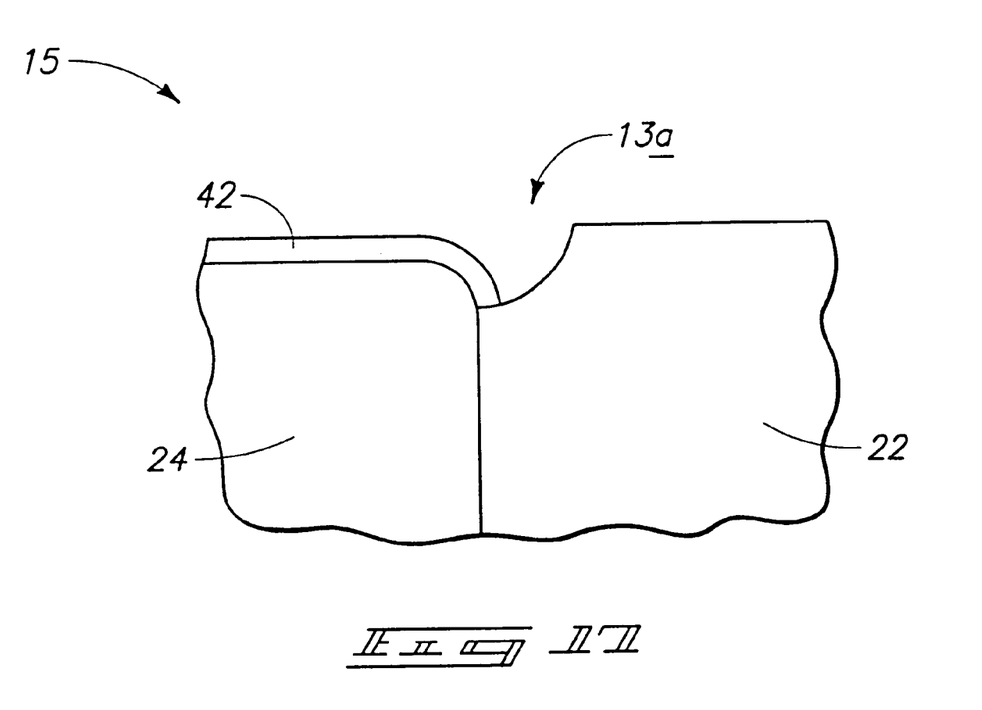
FIG. 17 is an enlarged diagrammatic sectional view of a portion of a wafer fragment processed in accordance with an aspect of the invention.

Such provides but one example of forming at least some FLASH transistor gates within the array and at least some non-FLASH transistor gates within the periphery, and in one embodiment, having a floating gate dielectric of a first thickness within the array which is different from a gate dielectric thickness of non-FLASH field effect transistor gates within the periphery. Further, such provides but one exemplary processing whereby the sacrificial masking layer, preferably comprising silicon nitride, is removed from the periphery prior to forming any layer which functions as a gate dielectric layer within the periphery, and during formation of FLASH field effect transistors within the array. By way of example only, FIG. 17 depicts in enlarged view a preferred intended effect of a reduced gate oxide thinning in comparison to that shown by FIG. 1. FIGS. 1 and 17 depict enlarged sectional views taken at ninety degrees to those diagrammatically shown in FIGS. 2–16.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method forming an array of FLASH field effect transistors and circuitry peripheral to such array, comprising:

providing a pad oxide over an array area and a periphery area of a semiconductor substrate;

providing a silicon nitride comprising layer over the pad oxide at least within the periphery area;

forming a mask over the silicon nitride comprising layer in the periphery area while leaving the array area exposed, and then conducting at least one conductivity modifying implant into the substrate through the pad oxide within the array area using the mask;

after the conducting, removing the mask; and after removing the mask, forming at least some FLASH transistor gates within the array area and at least some non-FLASH transistor gates within the periphery area.

2. The method of claim 1 wherein the silicon nitride comprising layer is provided to a thickness of no greater than 300 Angstroms.

3. The method of claim 1 wherein the silicon nitride comprising layer is provided to a thickness of from 100 Angstroms to 200 Angstroms.

4. The method of claim 1 comprising removing the silicon nitride comprising layer from the periphery area prior to forming any gate dielectric layer within the periphery area.

5. The method of claim 1 comprising removing the silicon nitride comprising layer from the periphery area during formation of FLASH field effect transistors within the array area.

6. The method of claim 1 comprising removing the silicon nitride comprising layer from the periphery area during formation of FLASH field effect transistors within the array area and prior to forming any gate dielectric layer within the periphery area.

7. The method of claim 1 further comprising thermally growing a sacrificial oxide layer at least within the array area after providing the silicon nitride comprising layer, the silicon nitride comprising layer restricting oxidation of substrate within the periphery area during the thermally growing.

8. The method of claim 1 wherein the silicon nitride comprising layer is provided over the pad oxide within the array area, the conductivity modifying implant being conducted through the silicon nitride comprising layer received within the array area.

9. The method of claim 8 comprising:

removing the silicon nitride comprising layer from the array area using the mask; and after removing the silicon nitride comprising layer from the array area and after removing the mask, thermally growing a sacrificial oxide layer within the array area, the silicon nitride comprising layer restricting oxidation of substrate within the periphery area during the thermally growing.

10. The method of claim 1 wherein the mask comprises photoresist.

11. The method of claim 1 wherein the conductivity modifying implant is a $V_t$ implant.

12. The method of claim 1 wherein the conductivity modifying implant is a channel enhancement implant.

13. The method of claim 1 comprising forming the non-FLASH transistor gates within the periphery area to have greater thickness gate dielectric than that of the FLASH transistor gates within the array area.

14. The method of claim 1 comprising forming the non-FLASH transistor gates within the periphery area to have greater thickness gate dielectric than that of the FLASH transistor gates within the array area, and forming the gate dielectric of the array area FLASH transistors prior to forming the gate dielectric of the periphery area non-FLASH transistors.

15. A method of forming an array of FLASH field effect transistors and circuitry peripheral to such array, comprising:

forming a sacrificial masking layer over a pad oxide within an array area and a periphery area of a semiconductor substrate, the sacrificial masking layer being oxide etch resistant;

forming a mask over the sacrificial masking layer in the periphery area while leaving the sacrificial masking layer in the array area exposed, and then conducting at least one conductivity modifying implant into the substrate through the pad oxide within the array area using the mask;

using the mask, removing the sacrificial masking layer exposed in the array area while leaving the sacrificial masking layer masked within the periphery area;

after said removing of the sacrificial masking layer exposed in the array area, removing the mask;

after removing the mask, etching oxide from the array area, the sacrificial masking layer in the periphery area restricting etching of oxide within the periphery area during said etching; and after said etching, forming at least some FLASH transistor gates within the array area and at least some non-FLASH transistor gates within the periphery area.

16. The method of claim 15 wherein the sacrificial masking layer comprises silicon nitride.

17. The method of claim 15 wherein the sacrificial masking layer is formed to a thickness of no greater than 300 Angstroms.

18. The method of claim 15 wherein the sacrificial masking layer comprises at least one of aluminum oxide, silicon carbide and polysilicon.

19. The method of claim 15 wherein the sacrificial masking layer is removed after the implant.

20. The method of claim 15 wherein the sacrificial masking layer is removed before the implant.

21. The method of claim 15 comprising etching the sacrificial masking layer from the periphery.

22. The method of claim 15 comprising etching the sacrificial masking layer and any remaining pad oxide from the periphery area during formation of FLASH gates within the array area.

23. The method of claim 15 wherein the conductivity modifying implant is a $V_t$ implant.

24. The method of claim 15 wherein the conductivity modifying implant is a channel enhancement implant.

25. The method of claim 15 comprising forming the non-FLASH transistor gates within the periphery area to have greater thickness gate dielectric than that of the FLASH transistor gates within the array area.

26. The method of claim 15 comprising forming the non-FLASH transistor gates within the periphery area to have greater thickness gate dielectric than that of the FLASH transistor gates within the array area, and forming the gate dielectric of the array area FLASH transistors prior to forming the gate dielectric of the periphery area non-FLASH transistors.

* * * * *

UNITED STATES PATENT AND TRADEMARK OFFICE
CERTIFICATE OF CORRECTION

PATENT NO.    : 6,645,814 B1
DATED         : November 11, 2003
INVENTOR(S)   : Roger W. Lindsay et al.

It is certified that error appears in the above-identified patent and that said Letters Patent is hereby corrected as shown below:

Title page,
Item [30], Related U.S. Application Data, replace "now U.S. Pat. No. 6,579,763," with -- now U.S. Pat. No. 6,746,921, --

Column 3,
Line 54, Brief Description Of The Drawings, replace "fragment at a processing in accordance with an aspect of the" with -- fragment at a processing step in accordance with an aspect of the --

Column 8,
Line 46, replace "sacrificial masking layer from the periphery." with -- sacrificial masking layer from the periphery area. --

Signed and Sealed this

Third Day of August, 2004

JON W. DUDAS
*Acting Director of the United States Patent and Trademark Office*